United States Patent
Hoogzaad et al.

(10) Patent No.: US 11,316,515 B2
(45) Date of Patent: Apr. 26, 2022

(54) RF SWITCH CIRCUIT

(71) Applicant: NXP B.V., Eindhoven (NL)

(72) Inventors: Gian Hoogzaad, Nijmegen (NL); Jozef Bergervoet, Eindhoven (NL)

(73) Assignee: NXP B.V., Eindhoven (NL)

( * ) Notice: Subject to any disclaimer, the term of this patent is extended or adjusted under 35 U.S.C. 154(b) by 454 days.

(21) Appl. No.: 14/697,860

(22) Filed: Apr. 28, 2015

(65) Prior Publication Data

US 2015/0318852 A1 Nov. 5, 2015

(30) Foreign Application Priority Data

Apr. 30, 2014 (EP) .................................... 14166710

(51) Int. Cl.
 *H03K 17/687* (2006.01)
 *H03K 17/06* (2006.01)
 *H03K 17/693* (2006.01)

(52) U.S. Cl.
 CPC ......... *H03K 17/687* (2013.01); *H03K 17/063* (2013.01); *H03K 17/6874* (2013.01); *H03K 17/693* (2013.01); *H03K 2017/066* (2013.01); *H03K 2217/0054* (2013.01)

(58) Field of Classification Search
 CPC ............................ H03K 17/063; H03K 17/687
 USPC .......................................... 327/378, 512, 513
 See application file for complete search history.

(56) References Cited

U.S. PATENT DOCUMENTS

| | | | |
|---|---|---|---|
| 6,502,047 B1* | 12/2002 | Wen | G01K 3/00 327/513 |
| 7,030,515 B2 | 4/2006 | Struble et al. | |
| 7,710,189 B2* | 5/2010 | Toda | H03K 17/6871 327/427 |
| 2004/0235549 A1* | 11/2004 | Struble | H01P 1/15 463/16 |
| 2006/0267666 A1 | 11/2006 | Toda | |
| 2009/0291645 A1* | 11/2009 | Chu | H04B 1/48 455/78 |
| 2010/0207679 A1 | 8/2010 | Okashita | |
| 2014/0028357 A1 | 1/2014 | Mehta et al. | |
| 2014/0043110 A1 | 2/2014 | Kobori et al. | |
| 2014/0062577 A1 | 3/2014 | Chih-Sheng | |
| 2015/0145587 A1 | 5/2015 | Sigetani et al. | |

FOREIGN PATENT DOCUMENTS

| | | |
|---|---|---|
| CN | 1354899 A | 6/2002 |
| CN | 1425242 A | 6/2003 |
| EP | 1 182 729 A1 | 2/2002 |
| WO | WO-2014/024340 A1 | 2/2014 |

OTHER PUBLICATIONS

Extended European Search Report for Patent Appln. No. 14179725.8 (dated Jan. 4, 2016).

* cited by examiner

*Primary Examiner* — Lincoln D Donovan
*Assistant Examiner* — Colleen J O Toole (57) ABSTRACT

A RF switching arrangement (400) is described including a bias swap circuit (30). The bias swap circuit switches the bias voltage dependent on the state of the RF switch. This improves the performance of the RF switch without requiring charge pump circuitry.

20 Claims, 5 Drawing Sheets

RF SWITCH CIRCUIT

CROSS-REFERENCE TO RELATED APPLICATIONS

This application claims the priority under 35 U.S.C. § 119 of European patent application no. 14166710.5, filed on Apr. 30, 2014 the contents of which are incorporated by reference herein.

This invention relates to radio frequency (RF) switching circuits for coupling an antenna to a RF transceiver.

RF antenna switches are typically used to connect a RF transceiver to an antenna. RF transceivers may typically have a power amplifier (PA) to transmit an output RF signal and a low noise amplifier (LNA) to receive an RF input signal. A common RF switch topology is the single pole double throw (SPDT) which is a circuit arrangement with three RF-ports. The SPDT RF switch can be used for example in wireless local area network (WLAN) front-ends in a transmit mode to connect the PA output to the antenna with a disconnected LNA. In a receive mode the SPDT RF switch typically connects the antenna to the LNA input with a disconnected PA. Other antenna switching circuits may be used for example to connect cellular or Bluetooth transceivers to an antenna. The RF antenna switching arrangements are typically on a separate die to the transceiver packaged in a module.

Figure 1:
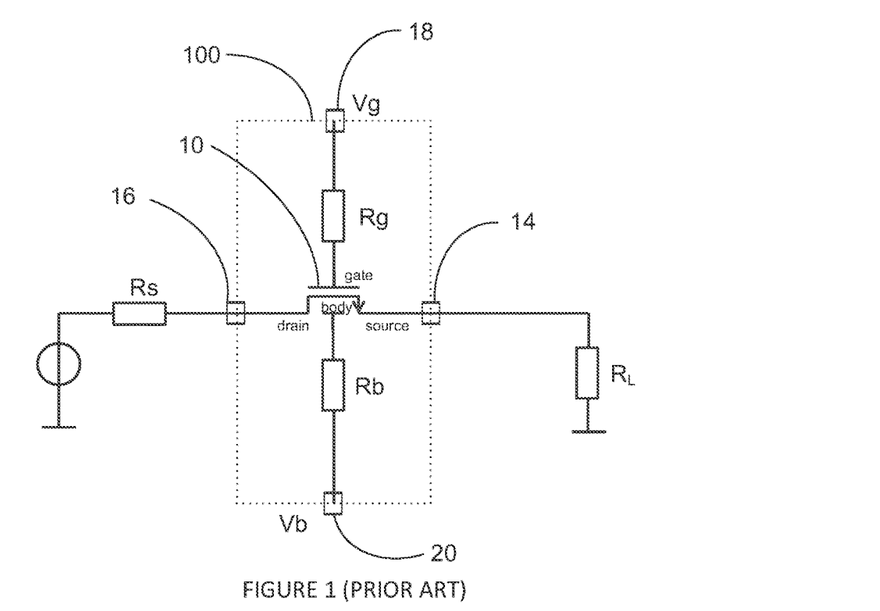
FIG. 1 shows a known MOSFET RF switch.

A single MOSFET 10 may be used to implement a simple switch 100 as illustrated in FIG. 1. RF input 16 may be driven from an RF source with source impedance Rs of typically 50Ω with voltage Vin. Output terminal 14 may be connected to a RF load with load impedance Rl of typically 50Ω. The voltage level at output terminal 14 may be denoted by Vout. Typically only n-type FETs will be used for RF switching since these have higher mobility carrier compared to p-type FETs resulting in lower switch on-resistance between the drain and the source Rds-on, which results in lower insertion loss. Insertion loss is the attenuation or power loss of the signal travelling through the switch from input 16 to output 14 when the switch is turned on, that is to say when the MOSFET switch has an electrically conducting channel. When the switch is turned off there will still be signal leakage from input 16 to output 14 because of the non-zero capacitance Cds-off from drain to source of MOS transistor 10: the ratio of Vout to Vin in this case is a measure of the leakage and hence the switch isolation. The size of the switch presents a trade-off between insertion loss and switch isolation which is incorporated in a Figure-of-Merit defined as the product of Rds-on and Cds-off.

As shown in FIG. 1, the resistors Rg and Rb may be added to bootstrap the gate and body terminals of the MOSFET 10 respectively. Consequently these terminals will average the RF signal on the source and drain. In the on-state, where the RF signal on source and drain are almost equal, the bootstrap resistors may nullify the effect of various parasitic capacitances between drain/source and gate/body which may result in improved bandwidth and linearity. Typical values for Rg and Rb are larger than 1 kΩ. In operation, the body resistor Rb may be connected to 0 volts and the drain and the source terminals are biased at 0 volts via the source resistance Rs and the load resistance RL. For example for a CMOS circuit with a power supply of 2.5 volts, the switch may be turned on by applying a gate voltage Vgate via control input 18 to the switch, with gate voltage Vgate of 2.5 volts. The switch may be turned off with Vgate of 0 volts, but only weakly since an RF swing between drain and source of twice a diode or threshold voltage will start turning the MOSFET on reducing the isolation of the signal with a consequent increase in signal loss.

Figure 2:
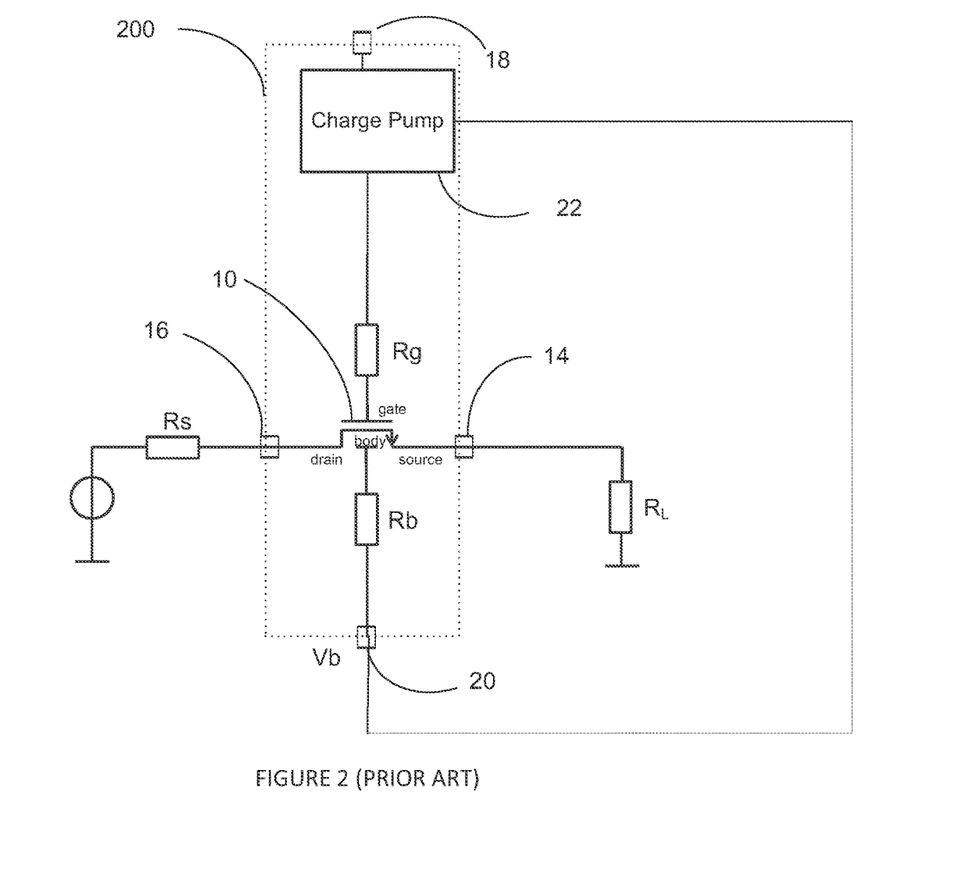
FIG. 2 illustrates a known MOSFET RF switch.

FIG. 2 shows an example of a known MOSFET switch 200 operating with a power supply which may be for example 2.5 volts. The bias level of the RF signal is set to 0 volts. The switch may be turned on by applying a gate voltage Vgate to the switch of 2.5 volts.

To improve the isolation of the switch, a charge pump 22 may be included as illustrated in FIG. 2. The charge pump circuit 22 may be connected between the control input 18 and the gate boot strap resistor Rg. The charge pump may output a voltage of 2.5 volts when the input on the control terminal 18 is 2.5 volts and may also generate a voltage of −2.5 volts when the control input is 0 volts which may be used to switch off the transistor 10. A second output of the charge pump 22 may provide a voltage of −2.5 volts to the body resistor Rb. This arrangement improves the off-state of the switch but at the cost of extra circuitry.

Figure 3:
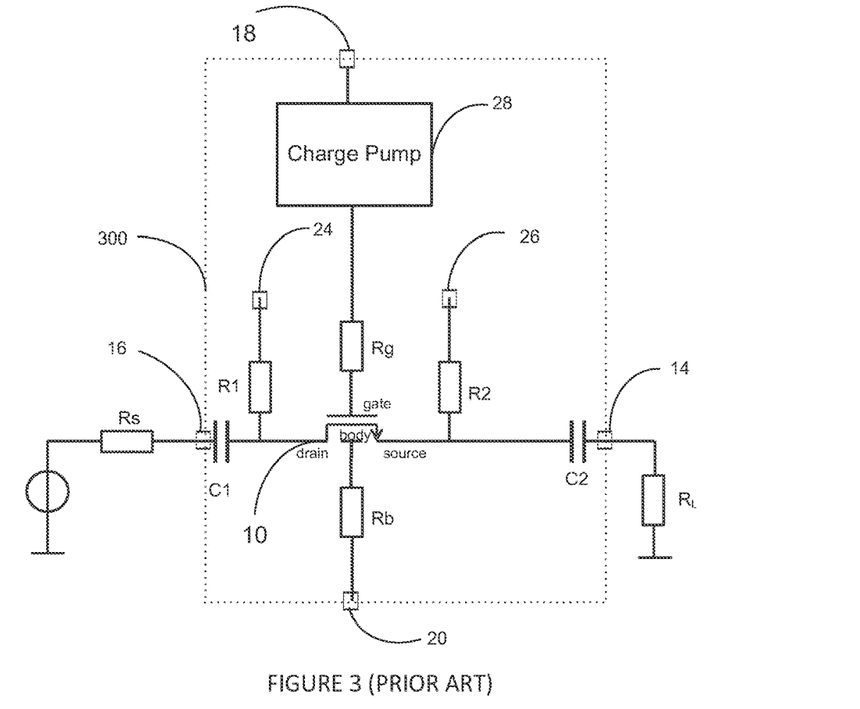
FIG. 3 shows a further known MOSFET RF switch.

FIG. 3 shows a further example of a known MOSFET switch 300 operating with a power supply of 2.5 volts. Bias resistor R1 is arranged between the drain of the MOSFET 10 and a bias supply voltage of 2.5 volts provided to terminal 24. Bias resistor R2 is arranged between the source of the MOSFET 10 and a supply voltage of 2.5 volts provided to terminal 26. Decoupling capacitor C1 may be arranged between the input and the drain of the MOSFET. Decoupling capacitor C2 may be arranged between the source of the MOSFET and the output. In this arrangement the input and output are decoupled from the transistor 10 allowing different bias points. To turn on the transistor 10 the control voltage Vgate must be at least 2.5 volts plus the threshold voltage. Since this voltage is greater than the typical supply voltage, charge pump 28 is coupled between the control input 18 and the gate to provide a turn on voltage of typically 5 volts and a turn off voltage of 0 volts. In this bias arrangement a voltage of 2.5 volts will turn the switch off weakly and a voltage of 0 volts will be a stronger off-state.

Various aspects of the invention are defined in the accompanying claims.

In a first aspect there is defined a RF switching circuit for coupling an antenna to a RF circuit, the RF switching circuit having a first mode of operation and a second mode of operation and comprising: a switch arranged to switchably couple a RF signal input to a RF signal output and comprising a first transistor having a first terminal, a second terminal, and a control terminal; a bias swapping circuit having a bias voltage output coupled to the first terminal and the second terminal; wherein the bias swapping circuit is operable to switch the bias voltage output between a first bias voltage value and a second bias voltage value in response to a change in the mode of operation of the RF switching circuit.

By switching the bias voltage values on the first and second terminals of the transistor when the RF switching circuit changes, the performance of the RF switch may be improved as the switch may be more strongly switched on or switched off. Furthermore, switching the bias voltages when the RF switch circuit mode changes means that the improved performance may be achieved using the supply voltages required for the other circuitry. Consequently the RF switch performance may be improved without additional charge pump circuitry to generate voltage levels outside the normal supply voltage range.

Embodiments of the RF switching circuit may have a mode controller coupled to the bias swapping circuit and the control terminal and operable to switch the RF switching circuit between the first mode of operation and the second mode of operation.

The mode controller may control in which mode the RF switch or a device including the RF switch is operating. For example the mode controller may switch between a transmit mode of operation and a receive mode of operation. The mode controller may be implemented using hardware or a combination of hardware and software.

In embodiments, the RF switching circuit may comprise a RF signal power detector coupled to the bias swapping circuit and at least one of the RF signal input and the RF signal output, and wherein the bias swapping circuit is further operable to vary the voltage on the bias voltage output in response to a change in the detected RF signal power.

The RF switching circuit may vary the bias voltage according to the signal strength to trade-off the electric field strength versus how strongly the switch is switched off or switched on. Varying the bias voltage dependent on signal strength may reduce the stress placed on the device during switching and so improve the lifetime of the RF switching circuit while maintaining acceptable switch performance.

In embodiments the RF switching circuit may comprise a power supply detector coupled to the bias swapping circuit, wherein the bias swapping circuit is further operable to vary the voltage on the bias voltage output in response to a change in the detected power supply voltage and/or current.

A battery powered device which may have a supply voltage which decreases over time. The detected supply voltage may be used to adjust the bias voltage to improve the switch performance.

In embodiments, the RF switching circuit may comprise a temperature sensor coupled to the bias swapping circuit, wherein the bias swapping circuit is further operable to vary the voltage on the bias voltage output in response to a change in the detected temperature.

Embodiments including a temperature sensor may vary the bias voltage to avoid the risk of de-biasing the RF switch at high temperatures.

Embodiments of the RF switching circuit may comprise a switch comprising at least one further transistor arranged in series with the first transistor, and wherein the control terminal of the first transistor is coupled to a control terminal of the at least one further transistor and the bias swap circuit output is coupled to a first terminal and a second terminal of the at least one further transistor.

A series of transistors may be used to handle larger power signals by dividing the voltage stress. Larger power signals may then be handled without the switch breaking down or turning on when in an off-state.

Embodiments may include a bootstrap element coupled to each transistor control terminal. The bootstrap element may be a resistor and an inductor. Both resistors and inductors can provide high impedance at RF frequencies which is required for proper bootstrapping. An inductor also provides low impedance at low frequencies.

In embodiments, the RF switching comprises a first decoupling capacitor arranged between the RF signal input and the switch and a second decoupling capacitor arranged between the RF signal output and the switch. The decoupling capacitors allow the biasing of the switch circuitry to be set independently of the bias level at the signal input and output.

In embodiments the RF switch may comprise a shunt transistor coupled to the RF signal input. The shunt transistor may be switched on used when the signal path to the input is switched off. The shunt transistor may protect the RF signal transistor by shunting any signals which feed-through the switched off signal path to ground.

In embodiments the RF switching circuit may further comprise a RF input terminal, a RF output terminal and an antenna terminal, wherein the bias swapping circuit further comprises a second bias voltage output, the switch further comprises a second transistor, the second transistor having a first terminal, a second terminal and a control terminal, wherein the second transistor first terminal is coupled to an RF output terminal, the second transistor second terminal is coupled to the antenna terminal, the second transistor first terminal and second transistor second terminal are coupled to the second bias voltage output, the first transistor first terminal is coupled to the RF input terminal, and the first transistor second terminal is coupled to the antenna terminal; wherein the RF switching circuit is operable to either couple the RF input terminal to the antenna terminal or to couple the antenna terminal to the RF output terminal, and the bias swapping circuit is operable to swap the first bias voltage value and the second bias voltage value between the first bias voltage output and the second bias voltage in response to a change in operating mode of the RF switching circuit.

The RF switching circuit may implement a SPDT switch which may connect a transmitter output to the antenna in a transmit mode and connect an antenna to a receiver input in a receive mode.

In embodiments, a RF switch circuit may be included in a RF transceiver.

An RF transceiver and the RF switching circuit may be implemented on a single integrated circuit. By simplifying the bias arrangements, the RF switch may be more easily integrated together with a RF transceiver using CMOS technology.

In embodiments a mobile device may comprise the RF switching circuit.

In embodiments a mobile device may comprise the RF switching circuit implementing a SPDT switch, an antenna, and a RF transceiver wherein the RF input terminal is coupled to an output of the RF transceiver, and the RF output terminal is coupled to an input of the RF transceiver, and the antenna is coupled to the antenna terminal.

In embodiments, the transistors may be MOSFET transistors.

In the figures and description like reference numerals refer to like features. Embodiments of the invention are now described in detail, by way of example only, illustrated by the accompanying drawings in which.

Figure 4:
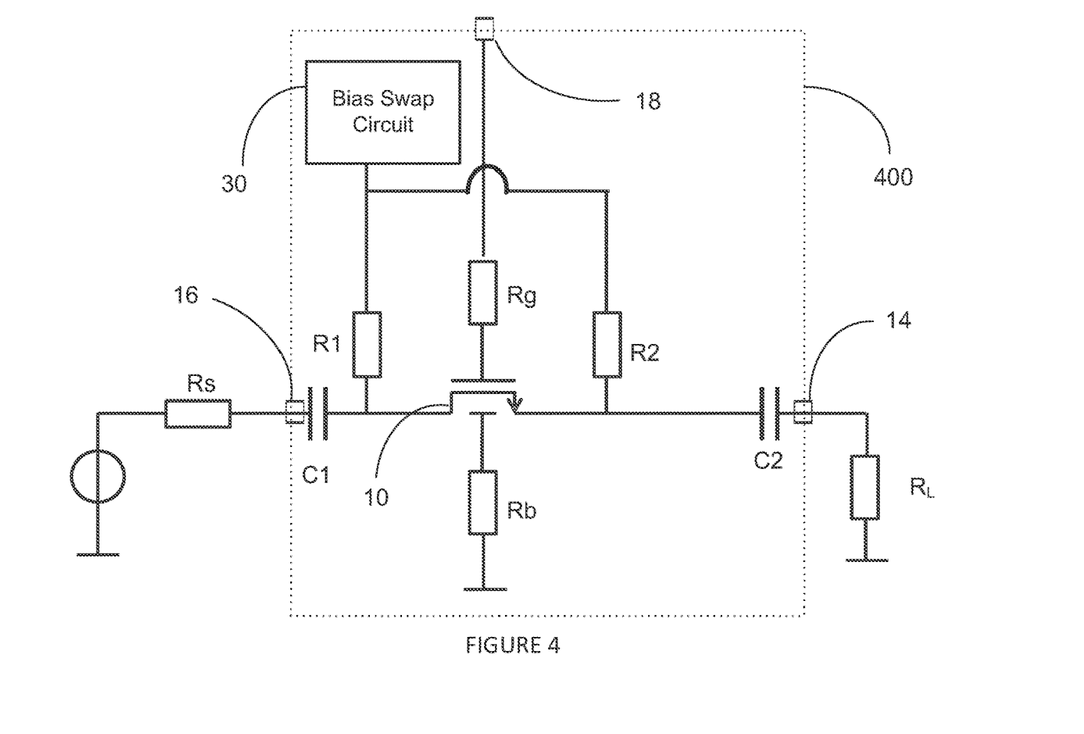
FIG. 4 illustrates a RF switch according to an embodiment.

FIG. 4 shows an RF switch circuit 400. The first resistor R1 may be connected between the drain of NMOS transistor 10 and an output of bias swap circuit 30. The second resistor R2 may be connected between the source of NMOS transistor 10 and an output of bias swap circuit 30. Decoupling capacitor C1 may be connected between the drain of NMOS transistor 10 and the RF input 16 of the RF switch. Decoupling capacitor C2 may be connected between the source of the NMOS transistor 10 and the RF output 14. The bootstrap gate resistor Rg may be connected between the control input 18 and the control terminal or gate of the NMOS 10. Body bias resistor Rb may be connected to a bias voltage supply rail which may be a ground potential.

In operation the RF input 16 may be connected to an RF signal source with source impedance Rs. RF signal source may be for example a RF power amplifier or an antenna. The RF switch RF output 14 may be connected to an output load represented by RL. This output load may be for example an antenna or a low noise amplifier.

The bias swap circuit 30 may output different bias voltages depending on the operating conditions of the RF switch 400. For an example supply voltage of 2.5 volts, the bias swap circuit 30 may output 0 volts when the switch is on and 2.5 volts when the switch is off. The condition when the switch is on may be considered as one operating mode and when the switch is off may be considered to be a second operating mode. To switch on the RF switch 400, a voltage of 2.5 volts may be applied to the input terminal 18 and the drain and source may be biased at 0 volts by the bias swap circuit 30. The NMOS transistor 10 which may be considered to be configured as a switch is then fully switched on. To switch off the RF switch 400, a voltage of 0 volts may be applied to input terminal 18. Because the bias voltage is changed or swapped by the bias swap circuit 30, the RF switch is in a strong off state and consequently has the ability to handle larger signals. The bias swap circuit 30 improves the performance of the RF switch 300 without requiring additional charge pump circuitry.

The skilled person will appreciate that a bias swap circuit which swaps the bias voltage between power supply rail voltage values such as 2.5 volts and 0 volts may be implemented with less circuitry than is required to implement a charge pump. This may make it possible to integrate the RF switch with other circuitry for example an RF transceiver on the same die using a process such as the NXP Qubic4 process which has 5.3 nm gate oxide and 0.25 µm minimal channel length MOSFETs this means the gate to source or gate to drain voltage has a typical maximum value of 2.5V.

In other examples, the bias swap circuits may also swap between more than two voltage levels. The bias swap circuit may be connected to the input terminal 18 to trigger the bias change directly when the voltage applied to the gate changes. Alternatively the bias swap circuit may be connected to another circuit to trigger the change in bias voltage.

The supply voltage may be provided by battery in a mobile device including an RF switch 400. The battery voltage output may for example be in the range of 2.3 volts to 4.8 volts.

NMOS transistor 10 may be symmetric in which case it does not matter which terminal is source or drain. Consequently, arbitrary sources and drains have been assigned in FIG. 4. For RF switches where the MOS device is asymmetric for example with an extended drain, it may be considered that the drain is the terminal that can handles the higher voltages and consequently will have most of the voltage stress.

RF switch 400 includes bootstrapping with resistors. Other examples may implement bootstrapping with inductors. Both resistors and inductors may provide a high impedance at RF frequencies which is required for proper bootstrapping. An inductor provides a low impedance at low frequencies, but may be larger than a resistor.

NMOS transistor 10 is shown with a body connection. This body or p-well (for an NMOSFET) may be either connected through the substrate, or directly as is done in an isolated device. The n-type isolation in an isolated device may also be bootstrapped.

Figure 5:
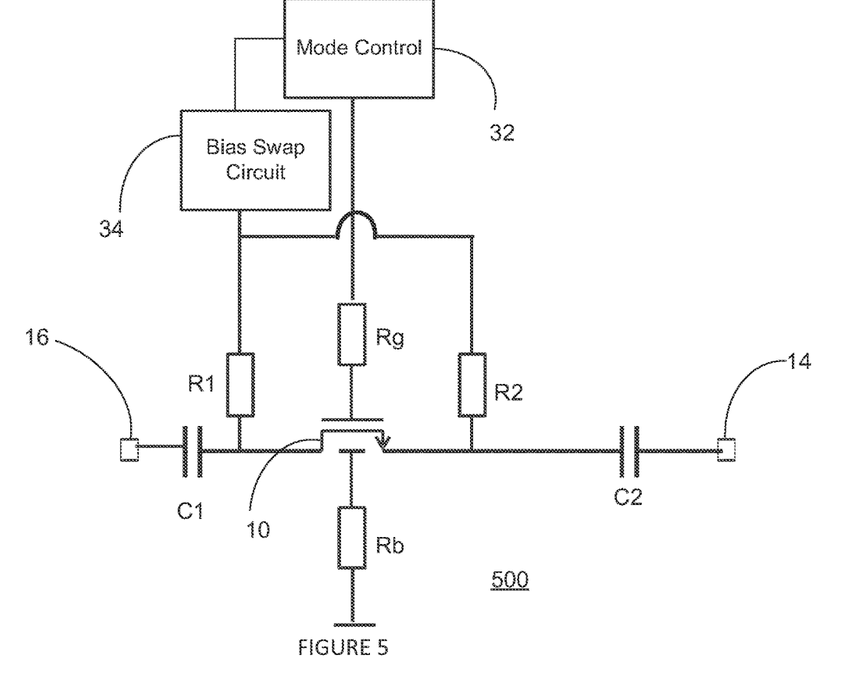
FIG. 5 shows a RF switch with mode detection according to an embodiment.

FIG. 5 illustrates a RF switch 500 with a mode control 32 for controlling the mode of the RF switch 500. The bootstrap gate resistor Rg may be connected between an output of mode control 32 and the gate of NMOS transistor 10. The bias swap circuit 30 may have an input connected to an output of the mode control 32. The output of the mode control 32 may indicate the operating mode the RF switch 500. The first resistor R1 may be connected between the drain of NMOS transistor 10 and an output of bias swap circuit 30. The second resistor R2 may be connected between the source of NMOS transistor 10 and an output of bias swap circuit 34. Decoupling capacitor C1 may be connected between the drain of NMOS transistor 10 and the input 16 of the RF switch. Decoupling capacitor C2 may be connected between the source of the NMOS transistor 10 and the RF output 14. Body bias resistor Rb may be connected to a bias voltage supply rail which may be a ground potential or zero volts.

Mode control 32 may switch the RF switch 500 in response to the change in mode of a circuit. This may be for example a change between a transmit mode and a receive mode of a circuit such as a RF transceiver. The mode control 32 may trigger the bias swap circuit 34 to change or swap the bias voltage level at the source and drain of the NMOS transistor 10. The mode control 32 may switch the RF switch on or off by switching the NMOS transistor 10. The mode control 32 may trigger the bias swap circuit 34 to change at the same time or at a different time to the NMOS transistor 10. To switch on the RF switch 500, a voltage of 2.5 volts may be applied to the gate of the NMOS transistor 10 by the mode control 32. The mode control 32 may trigger the bias swap circuit 34 to swap the bias voltage to a voltage of 0 volts. Consequently the bias voltage at the drain and source of the NMOS transistor 10 may be at 0 volts. The NMOS transistor 10 is then fully switched on. To switch off the RF switch 500, a voltage of 0 volts may be applied to the gate by mode control 32. The mode control 32 may trigger the bias swap circuit 34 to swap the bias voltage to 2.5 volts. The bias voltage at the drain and source of the NMOS transistor 10 may be 2.5 volts. Because the bias voltage is changed or swapped by the bias swap circuit 332, the RF switch 500 may be in a strong off state since the gate source voltage is −2.5 volts. Consequently RF switch 500 may handle larger RF input signals. Hence, the bias swap circuit 32 may improve the performance of the RF switch 500 without requiring additional charge pump circuitry.

Figure 6:
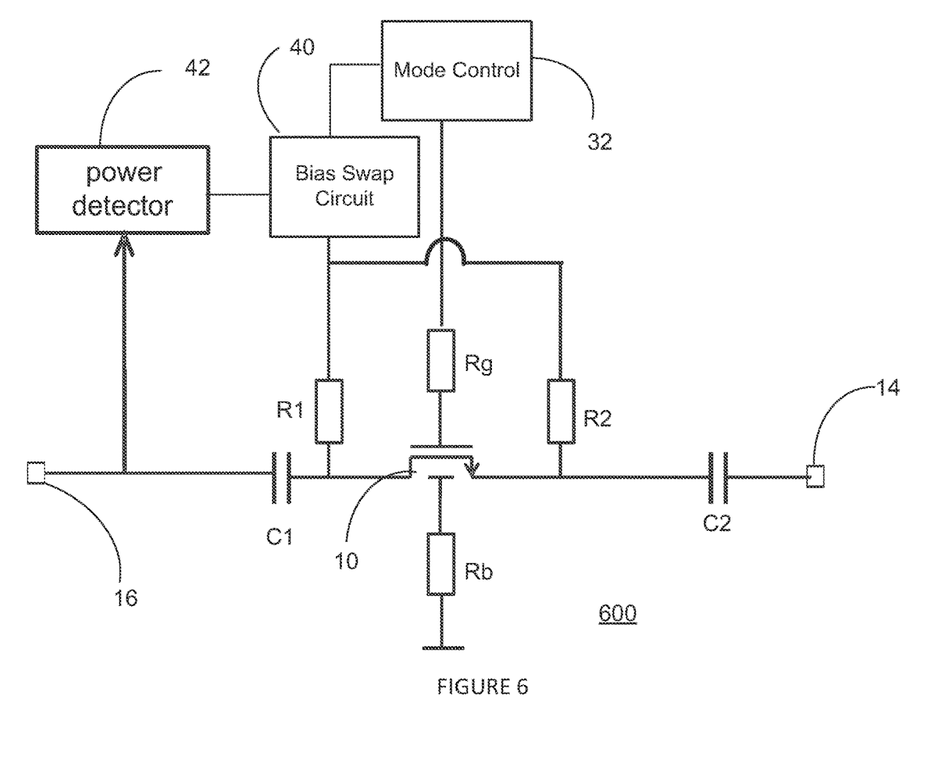
FIG. 6 illustrates a RF switch with signal power detection according to a further embodiment.

FIG. 6 shows a RF switch 600 which may swap the bias voltage dependent on the RF signal input level. An input of RF signal power detector 42 may be connected to the RF input 16. An output of the power detector 42 may be connected to bias swap circuit 40. An output of the mode control 32 may be connected to the bias swap circuit 40. The output of the mode control 32 may indicate the operating mode the RF switch 600.

The bootstrap gate resistor Rg may be connected between an output of mode control 32 and the gate of NMOS transistor 10. The first resistor R1 may be connected between the drain of NMOS transistor 10 and an output of bias swap circuit 40. The second resistor R2 may be connected between the source of NMOS transistor 10 and an output of bias swap circuit 40. The decoupling capacitor C1 may be connected between the drain of NMOS transistor 10 and the RF switch RF input 16. Decoupling capacitor C2 may be connected between the source of the NMOS transistor 10 and the RF output 14. Body bias resistor Rb may be connected to a bias voltage supply rail which may be a ground potential or zero volts.

Mode control 32 may switch the RF switch 600 similarly to RF switch 500 in response to the change in mode of a circuit. This may be for example a change between a transmit mode and a receive mode of an RF transceiver. By monitoring the power level of the input signal, the bias level can be optimized for small signals and large signals; for example the effect of the body voltage on the drain source resistance Rds-on can be minimised.

The power detector may be implemented as an analog power detector, and the bias swap circuit may vary the bias voltage within a continuous range of values in each mode.

Alternatively the power detector may be a discrete power detector which compares the power of the signal to a threshold value. In this case, the bias voltage may be swapped between a number of a discrete values in each mode.

When the bias voltage range is within the supply voltage 0 to $V_{CC}$, then no charge pump is needed.

For example, when the mode is off, the mode control 32 may switch off the NMOS transistor 10 by applying a voltage to the gate of 0 Volts. For small RF signals, the bias swap circuit 40 may output a bias voltage of 2.5 volts. The drain and source of NMOS transistor 10 are biased at 2.5 volts. For large RF signals, the bias swap circuit 40 may output a bias voltage of 3 volts, which increases the reverse bias of the gate source voltage to switch off the RF switch more strongly. However, this may increase the gate stress due to the larger electric field which may reduce the lifetime of the device. By minimizing the time when the larger voltage is applied during the off state, gate stress may be traded off with large signal capability only when it is really needed which may be only a fraction of the lifetime of the circuit.

A large RF signal may be a signal that is within 10 dBm of the circuit's 1 dB compression point (p1dB). Typically for a 1 W or 30 dBm switch with 33 dBm P1 dB a large RF signal may be greater than 23 dBm. A large RF signal may be an RF signal output from a power amplifier coupled to the RF input terminal 16. A small RF signal may be a RF signal received from an antenna coupled to the RF input terminal 16. A small RF signal may be the RF signal at the input of a Low Noise Amplifier coupled to the output terminal 14. The small RF signal may vary depending on the distance to a transmitter, and atmospheric conditions. The small RF signal may be for example between approximately +10 dBm which may be within 10 dBm of the 1 dB compression point in a receiver bypass mode, and −80 dBm which may be a signal level for a receiver in an amplifying mode.

In some embodiments of the RF switch a power detector may be connected to the RF output terminal 14 and the bias adjusted dependent on the RF output signal strength. Alternatively a power detector may be connected to both the RF input terminal 16 and the RF output terminal 14. In other examples the mode control 32 may be omitted and the gate of the NMOS transistor 10 coupled to the bias swap circuit 40.

Figure 7:
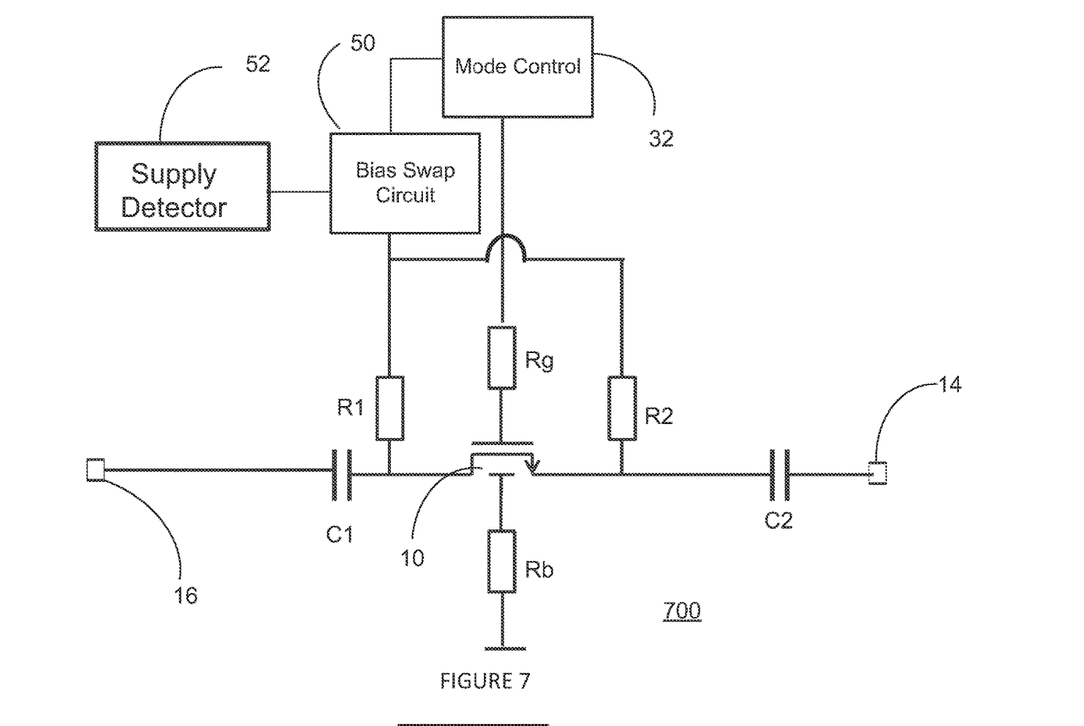
FIG. 7 shows a RF switch with power supply detection according to a further embodiment.

FIG. 7 shows a RF switch 700 which may swap the bias voltage dependent on the power supply level. A power supply detector 52 may be connected to the bias swap circuit 50. An output of the mode control 32 may be connected to an input the bias swap circuit 50. The output of the mode control 32 may indicate the operating mode the RF switch 700.

The bootstrap gate resistor Rg may be connected between an output of mode control 32 and the gate of NMOS transistor 10. The first resistor R1 may be connected between the drain of NMOS transistor 10 and an output of bias swap circuit 50. The second resistor R2 may be connected between the source of NMOS transistor 10 and an output of bias swap circuit 40. Decoupling capacitor C1 may be connected between the drain of NMOS transistor 10 and the RF switch RF input 16. Decoupling capacitor C2 may be connected between the source of the NMOS transistor 10 and the RF output 14. Body bias resistor Rb may be connected to a bias voltage supply rail which may be a ground potential or zero volts.

Mode control 32 may switch the RF switch 700 similarly to RF switch 500 in response to the change in mode of a circuit. The change of mode may be, for example, a change between a transmit mode and a receive mode of an RF transceiver. The RF switch 700 may be used for example in a mobile battery powered device which may have a supply voltage ranging from 2.3 volts to 4.8 volts. For example when the RF switch is on and the power supply detector 52 detects that the battery is charged at 3.8V the mode control 32 may apply a voltage of 3.8V to the gate of the NMOS transistor 10 and the bias swap circuit 50 may apply a voltage of 1.3V to the source and the drain of the NMOS transistor 10. If the power supply detector 52 detects that the battery is almost empty at 2.3V, the mode control 32 may apply a voltage of 2.3V to the gate of the NMOS transistor 10. The bias swap circuit 50 may output a voltage of 0V to the source and the drain of the NMOS transistor 10. Consequently the influence of the junction capacitance on linearity may be minimized.

The skilled person will appreciate that the bias swap circuit 50 and the power supply detector 52 may be implemented using known circuit techniques.

In other examples of the RF switch including a power supply detector, the power supply detector may detect when a USB charger is connected and the bias swap circuit may apply a bias voltage of 2.3 volts. In other examples the mode control 32 may be omitted and the gate of the NMOS transistor 10 coupled to the bias swap circuit 50.

Figure 8:
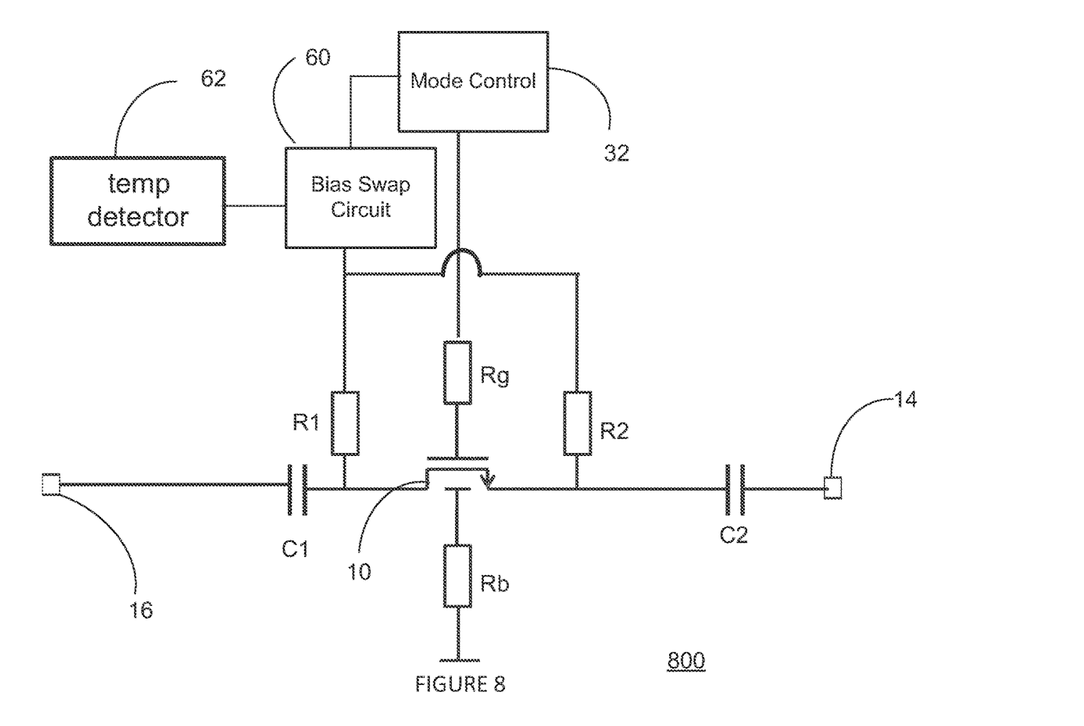
FIG. 8 shows a RF switch with temperature detection according to an embodiment.

FIG. 8 shows a RF switch 800 which may swap the bias voltage dependent on the temperature of the RF switch. A temperature detector 62 may be connected to the bias swap circuit 60. An output of the mode control 32 may be connected to the bias swap circuit 60.

The bootstrap gate resistor Rg may be connected between an output of mode control 32 and the gate of NMOS transistor 10. The first resistor R1 may be connected between the drain of NMOS transistor 10 and an output of bias swap circuit 60. The second resistor R2 may be connected between the source of NMOS transistor 10 and an output of bias swap circuit 40. Decoupling capacitor C1 may be connected between the drain of NMOS transistor 10 and the RF switch RF input 16. Decoupling capacitor C2 may be connected between the source of the NMOS transistor 10 and the RF output 14. Body bias resistor Rb may be connected to a bias voltage supply rail which may be a ground potential or zero volts.

The mode control 32 may switch the RF switch 800 similarly to RF switch 500 in response to the change in mode of a circuit. When the RF switch 800 is switched off the bias swap circuit may be triggered to swap the bias voltage to a voltage determined by the temperature detected by the temperature detector 62. This voltage may be a lower voltage than the supply voltage. So for example if the supply voltage is 2.5 volts, the bias swap circuit 60 may swap the bias voltage to a voltage of 2.5 volts if the temperature detected corresponds to a temperature of lower than 100 degrees Celsius. If the temperature detected corresponds to a temperature of higher than 100 degrees Celsius. The bias swap circuit 60 may swap the bias voltage to a voltage of 2 volts, thus reducing the reverse bias voltage to avoid the risk of de-biasing the RF switch 800 at high temperatures. In other examples the mode control 32 may be omitted and the gate of the NMOS transistor 10 coupled to the bias swap circuit 60.

Figure 9:
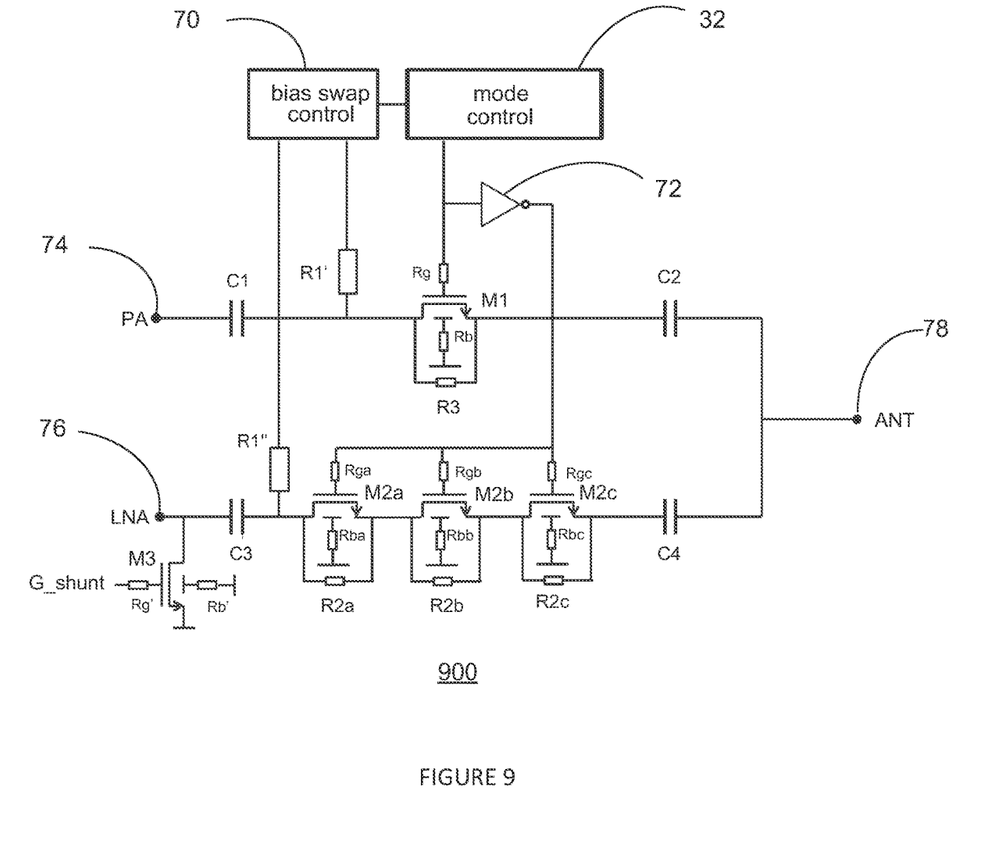
FIG. 9 illustrates a further implementation of an antenna RF switch circuit according to an embodiment.

FIG. 9 illustrates a single pole double throw RF switch 900. RF switch has a first input terminal 74 which may be connected to the output of a power amplifier. Bias swap circuit 70 may have an input connected to mode control 32. Decoupling capacitor C1 may be connected in series between input terminal 74 and a first terminal of NMOS transistor M1 which may be a drain. A bias resistor R1' may be connected between the first terminal of NMOS transistor and an output of bias swap control 70. A bias resistor R3 may be connected between the first terminal of NMOS transistor M1 and the second terminal of transistor M1 which may be a source. A gate bootstrap resistor Rg may be connected between the control terminal which may be a gate and a second output of mode control 32. Transistor M1 may have a body bias resistor Rb. A decoupling capacitor C2 may be connected between a second terminal of transistor M1 and an input/output terminal 78 which may be connected to an antenna.

The path from the input terminal 74 through the series arrangement of C1, M1 and C2 to the input/output terminal 78 may form a first RF switch signal path. RF switch 900 may have a second switch signal path including a series arrangement of three NMOS transistors M2a, M2b and M2c. Each of the NMOS transistors may have a respective gate bootstrap resistance Rga, Rgb and Rgc connected between the respective gate of transistor M2a, M2b and M2c and the output of inverter 72. Each of the NMOS transistors M2a, M2b and M2c may have a respective body bias resistor Rba, Rbb and Rbc connected to a terminal which may be at a ground potential. Each of the NMOS transistors M2a, M2b and M2c may have a respective bias resistor R4a, R4b, and R4c connected between the respective source and drain terminals terminal which may be at a ground potential.

RF output terminal 76 may be connected to a low noise amplifier. Decoupling capacitor C3 may be connected in series between output terminal 78 and a first terminal of NMOS transistor M2a which may be a drain. Decoupling capacitor C4 may be connected in series between RF input/output terminal 78 and a second terminal of NMOS transistor M2c which may be a source.

A bias resistor R1" may be connected between a first terminal of NMOS transistor M2a and a second output of bias swap control 70. In an alternative example, bias resistor R1" may be connected between one of the terminals of M2b or M2c and a second output of bias swap control 70. A shunt NMOS transistor M3 may have a first terminal which may be a drain connected to output terminal 78. The shunt transistor may have a second terminal which may be a source connected to a supply rail which may be at a ground potential. Shunt transistor M3 may have a gate bootstrap resistor connected between a gate of shunt transistor and a first output of mode control 32, the connection is not shown on the figure. Shunt transistor M3 may have a body bias resistor connected to a potential which may be a ground potential.

In operation the RF switch 900 may have a transmit mode in which transistor M1 is switched on and transistors M2a, M2b and M2c are switched off by mode control 32. An RF signal on input 74 which may be from a power amplifier may be transmitted to the input/output terminal 78 which may be connected to an antenna. Shunt transistor M3 may be switched on so that any leakage from the input/output terminal through the second signal path is shunted to ground. As a consequence, the series switch M2a, M2b and M2c has to handle the power level reliably without breaking or turning on. This corresponds to the required 1dB compression point of the M2a, M2b, M2c switch exceeding 30 dBm (equivalent to 1W, or 20V peak to peak for a 50Ω load). The stacking of the MOSFETs M2a, M2b and M2c may divide the voltage stress. The resistors R3, R4a, R4b and R4c are used to convey the appropriate DC bias level to the source and drain of each transistor, avoiding the requirement to have a connection from every source and drain directly to the bias swap circuit 32. When RF switch 900 is in transmit mode the mode control 32 may switch on transistor M1 by applying the supply voltage $V_{CC}$ to the gate. The supply voltage may be derived from a battery with a voltage range between 2.3 volts and 4.8 volts. Transistors M2a, M2b, and M2b will be consequently be switched off by the inverter 72. The mode control 32 may trigger the bias swap circuit to set the bias of the drain and source of M1 to voltage level of ($V_{CC}$-2.5) volts. The mode control 32 may trigger the bias swap circuit to set the bias of the drain and source of M2a, M2b, and M2c to a voltage level of 2.5 volts.

The RF switch 900 may have a receive mode in which transistor M1 is switched off and transistors M2a, M2b and M2c are switched on. An RF signal on input/output 78 which may be from an antenna may be transmitted to the output terminal 76 which may be connected to a low noise amplifier. Shunt transistor M3 is switched off. When RF switch 900 is in receive mode the mode control 32 may switch off transistor M1 by applying 0 volts to the gate. Transistors M2a, M2b, and M2b will consequently be switched on by the inverter 72 which may output a voltage of 2.5 volts. The mode control 32 may trigger the bias swap circuit to set the bias of the drain and source of M1 to a voltage level of 2.5 volts. The mode control 32 may trigger the bias swap circuit to set the bias of the drain and source of M2a, M2b, and M2c to a voltage level of 0 volts. The skilled person will appreciate that the RF switch 900 may swap the bias voltage of transistor M1 between ($V_{CC}$-2.5 volts) in transmit mode and 2.5 volts in receive mode and may swap the bias voltage of transistors M2a, M2b, and M2b between 2.5 volts in transmit mode and 0 volts in receive mode.

Decoupling capacitors may have values in the range from 10 pF to 100 pF. Bias resistors may have values in the range of 1k to 100 kOhm.

The skilled person will appreciate that example RF switches using PMOS transistors or a combination of NMOS and PMOS transistors may be used.

In embodiments a transceiver incorporating a RF switch may be integrated on a single integrated circuit. The integrated circuit may be implemented using CMOS technology or a BiCMOS technology. A transceiver incorporating an RF switch may be a WLAN, Bluetooth, Zigbee, LTE or Cellular basestation. Examples of the RF switch may be included in a mobile device such as a mobile phone, tablet, or laptop.

Although the appended claims are directed to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable sub combination.

The applicant hereby gives notice that new claims may be formulated to such features and/or combinations of such features during the prosecution of the present application or of any further application derived therefrom.

For the sake of completeness it is also stated that the term "comprising" does not exclude other elements or steps, the term "a" or "an" does not exclude a plurality, a single processor or other unit may fulfil the functions of several means recited in the claims and reference signs in the claims shall not be construed as limiting the scope of the claims.

The invention claimed is:

1. A RF switching circuit for coupling an antenna to a RF circuit, the RF switching circuit having a first mode of operation and a second mode of operation and comprising:
   a switch arranged to switchably couple an RF signal input to an RF signal output, the switch comprising a first transistor having a first terminal, a second terminal, and a control terminal;
   a controller circuit coupled to a bias swapping circuit and the control terminal and operable to switch the RF switching circuit between the first mode of operation and the second mode of operation by switching a gate voltage applied to the control terminal between a first gate voltage value and a second gate voltage value, the first mode of operation including an RF transmit mode and the second mode of operation including an RF receive mode;
   the bias swapping circuit having a bias voltage output coupled to the first terminal and the second terminal; and
   wherein the bias swapping circuit is coupled to an output of the controller circuit and is operable to switch the bias voltage output between a first bias voltage value and a second bias voltage value in response to a change in the mode of operation of the RF switching circuit from the first mode of operation to the second mode of operation, and is operable to switch the bias voltage output to a third bias voltage value in response to a change in a temperature associated with the switch, or a change in a voltage or current level of the RF signal input as received by the RF switching circuit from a power circuit during the second mode of operation.

2. The RF switching circuit of claim 1 further comprising a RF signal power detector coupled to the bias swapping circuit and to the RF signal input, and wherein the bias swapping circuit is further operable to vary the voltage on the bias voltage output in response to the change in the detected RF signal power associated with the RF signal input as received, and
   wherein the first, second and third bias voltage values respectively bias both the first and second terminal.

3. The RF switching circuit of claim 1 further comprising a power supply detector coupled to the bias swapping circuit, wherein the bias swapping circuit is further operable to vary the voltage on the bias voltage output in response to a change in the detected power supply voltage and/or current.

4. The RF switching circuit of claim 1 further comprising a temperature sensor coupled to the bias swapping circuit, wherein the bias swapping circuit is further operable to vary the voltage on the bias voltage output in response to a change in the detected temperature, and based on the varied voltage on the bias voltage output, mitigate de-biasing of the RF switching circuit.

5. The RF switching circuit of claim 1, wherein the switch comprises at least one further transistor arranged in series with the first transistor, and wherein the control terminal of the first transistor is coupled to a control terminal of the at least one further transistor and the bias swap circuit output is coupled to a first terminal and a second terminal of the at least one further transistor.

6. The RF switching circuit of claim 1 wherein each transistor further comprises a bootstrap element coupled to each transistor control terminal.

7. The RF switching circuit of claim 6 wherein the bootstrap element comprises one of a resistor and an inductor.

8. The RF switching circuit of claim 1 further comprising:
   a first decoupling capacitor arranged between the RF signal input and the switch and a second decoupling capacitor arranged between the RF signal output and the switch, wherein the first and second decoupling capacitors are configured and arranged with the bias swapping circuit to bias the switch independent of a bias level of the RF signal input and the RF signal output.

9. The RF switching circuit of claim 8 further comprising a shunt transistor coupled to the RF signal input.

10. The RF switching circuit of claim 1 further comprising a RF input terminal, a RF output terminal and an antenna terminal, wherein
    the bias swapping circuit further comprises a second bias voltage output, and
    the switch further comprises a second transistor, the second transistor having a first terminal, a second terminal and a control terminal, wherein the second transistor first terminal is coupled to an RF output terminal, the second transistor second terminal is coupled to the antenna terminal, the second transistor first terminal and second transistor second terminal are coupled to the second bias voltage output, the first transistor first terminal is coupled to the RF input terminal, and the first transistor second terminal is coupled to the antenna terminal;
    wherein the RF switching circuit is operable to either couple the RF input terminal to the antenna terminal or to couple the antenna terminal to the RF output terminal, and
    the bias swapping circuit is operable to swap the first bias voltage value and the second bias voltage value between the first bias voltage output and the second bias voltage in response to a change in operating mode of the RF switching circuit.

11. A RF transceiver comprising the RF switching circuit of any of claim 1.

12. An integrated circuit comprising the RF transceiver of claim 11.

13. A mobile device comprising the RF switching circuit of claim 1.

14. A mobile device comprising the RF switching circuit of claim 10, an antenna, and a RF transceiver, wherein the RF input terminal is coupled to an output of the RF transceiver, and the RF output terminal is coupled to an input of the RF transceiver, and the antenna is coupled to the antenna terminal.

15. An RF switching circuit for coupling an antenna to a RF circuit, the RF switching circuit having a first mode of operation and an alternative second mode of operation, each of the first and second modes of operation to correspond to the RF switching circuit being turned on, the circuit comprising:
   a switch arranged to switchably couple a RF signal input to a RF signal output, the switch comprising a first transistor having a first terminal, a second terminal, and a control terminal;
   a bias swapping circuit having a bias voltage output coupled to the first terminal and the second terminal;
   a RF signal power detector coupled to the bias swapping circuit and configured to detect a signal strength of the RF signal input; and
   wherein the bias swapping circuit is operable to vary the bias voltage output between at least three bias voltage values according to the signal strength of the RF signal input and a change in the mode of operation of the RF switching circuit.

16. The RF switching circuit of claim 15, wherein the bias swapping circuit is configured to vary the bias voltage output within a continuous range of values in each mode and according to the signal strength of the RF signal input.

17. The RF switching circuit of claim 1, further comprising a temperature sensor coupled to the bias swapping circuit and configured to detect the temperature, wherein the bias swapping circuit is further operable to vary a voltage value on the bias voltage output in response to the detected temperature being outside a predetermined threshold.

18. The RF switching circuit of claim 15, wherein the bias swapping circuit is further operable to switch the bias voltage output to a third bias voltage value in response to a change in a temperature associated with the switch, or a change in a voltage or current level of the RF signal input as received by the RF switching circuit from a power circuit during the second mode of operation, wherein the RF signal input is provided by the power circuit having a voltage or current power range.

19. The RF switching circuit of claim 15, wherein the RF input is connected to an RF signal source with source impedance and the RF signal output is connected to an output load.

20. The RF switching circuit of claim 1, further including:
   the power circuit coupled to the switch and having a voltage or current power range, and the power circuit being configured and arranged to provide the RF signal input,
   wherein the switch is susceptible to de-biasing at temperatures outside a threshold and susceptible to stress in response to the changes in the voltage or current level of the RF signal input, and wherein the bias swapping circuit is configured to be operable to switch the bias voltage output to the third bias voltage value to mitigate a risk of de-biasing or stress.

* * * * *